United States Patent
Liu et al.

(10) Patent No.: US 7,957,094 B1
(45) Date of Patent: Jun. 7, 2011

(54) THERMAL SOLUTION FOR DRIVE SYSTEMS SUCH AS HARD DISK DRIVES AND DIGITAL VERSATILE DISCS

(75) Inventors: Chenglin Liu, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/842,452

(22) Filed: Jul. 23, 2010

Related U.S. Application Data (62) Division of application No. 11/495,295, filed on Jul. 28, 2006, now Pat. No. 7,764,462.

(60) Provisional application No. 60/759,164, filed on Jan. 13, 2006.

(51) Int. Cl.
*G11B 33/14* (2006.01)

(52) U.S. Cl. .................................... 360/97.02

(58) Field of Classification Search ............. 360/97.01, 360/97.02, 97.03, 7.04, 99.08
See application file for complete search history.

(56) References Cited

U.S. PATENT DOCUMENTS

| | | |
|---|---|---|
| 5,169,703 A | 12/1992 | Miyazaki et al. |
| 5,245,486 A | 9/1993 | Hachiya et al. |
| 5,790,343 A | 8/1998 | Takano et al. |
| 6,057,982 A | 5/2000 | Kloeppel |
| 6,831,833 B2 | 12/2004 | Kim et al. |
| 7,006,355 B2 | 2/2006 | Wakabayashi et al. |
| 7,274,533 B2 | 9/2007 | Kimura et al. |
| 7,298,583 B2 | 11/2007 | Miyazaki et al. |
| 7,365,938 B2 | 4/2008 | Yoo |
| 7,383,557 B2 | 6/2008 | Toyoda et al. |
| 7,502,200 B2 | 3/2009 | Aoki |
| 7,589,962 B1 | 9/2009 | Bhatia |
| 2002/0070444 A1 | 6/2002 | Turner |
| 2004/0184128 A1 | 9/2004 | Mikami |
| 2005/0160702 A1 | 7/2005 | Perreault et al. |
| 2006/0001159 A1* | 1/2006 | Garcia et al. .................. 257/747 |
| 2006/0006480 A1* | 1/2006 | Shinozaki et al. ............ 257/401 |
| 2006/0021903 A1 | 2/2006 | Perreault et al. |
| 2006/0024531 A1 | 2/2006 | Murakami |
| 2006/0124585 A1 | 6/2006 | Suwa et al. |
| 2006/0158049 A1 | 7/2006 | Suzuki et al. |
| 2007/0121286 A1 | 5/2007 | Foster et al. |

\* cited by examiner

*Primary Examiner* — Allen T Cao

(57) ABSTRACT

A drive system includes a printed circuit board. A first integrated circuit is associated with the printed circuit board. A drive assembly case is connected to the printed circuit board. A first thermal interface material, wherein (i) the thermal interface material is in thermal contact with the first integrated circuit and (ii) the drive assembly case is in thermal contact with the thermal interface material. The drive assembly case dissipates thermal energy generated by the first integrated circuit.

11 Claims, 10 Drawing Sheets

THERMAL SOLUTION FOR DRIVE SYSTEMS SUCH AS HARD DISK DRIVES AND DIGITAL VERSATILE DISCS

CROSS-REFERENCE TO RELATED APPLICATIONS

This application is a divisional of U.S. Non-Provisional application Ser. No. 11/495,295, filed Jul. 28, 2006, which claims the benefit of U.S. Provisional Application No. 60/759,164, filed Jan. 13, 2006. The disclosures of the above applications are incorporated herein by reference in their entirety.

FIELD

The present disclosure relates to hard disk drives (HDD).

BACKGROUND

Electronic devices such as computers, laptops, personal video recorders (PVRs), MP3 players, game consoles, set-first boxes, digital cameras, and other electronic devices often need to store a large amount of data. Storage devices such as hard disk drives (HDDs) and digital versatile discs (DVDs) may be used to meet these storage requirements. As the size of these devices decreases, heat dissipation has become more problematic.

Figure 1A:
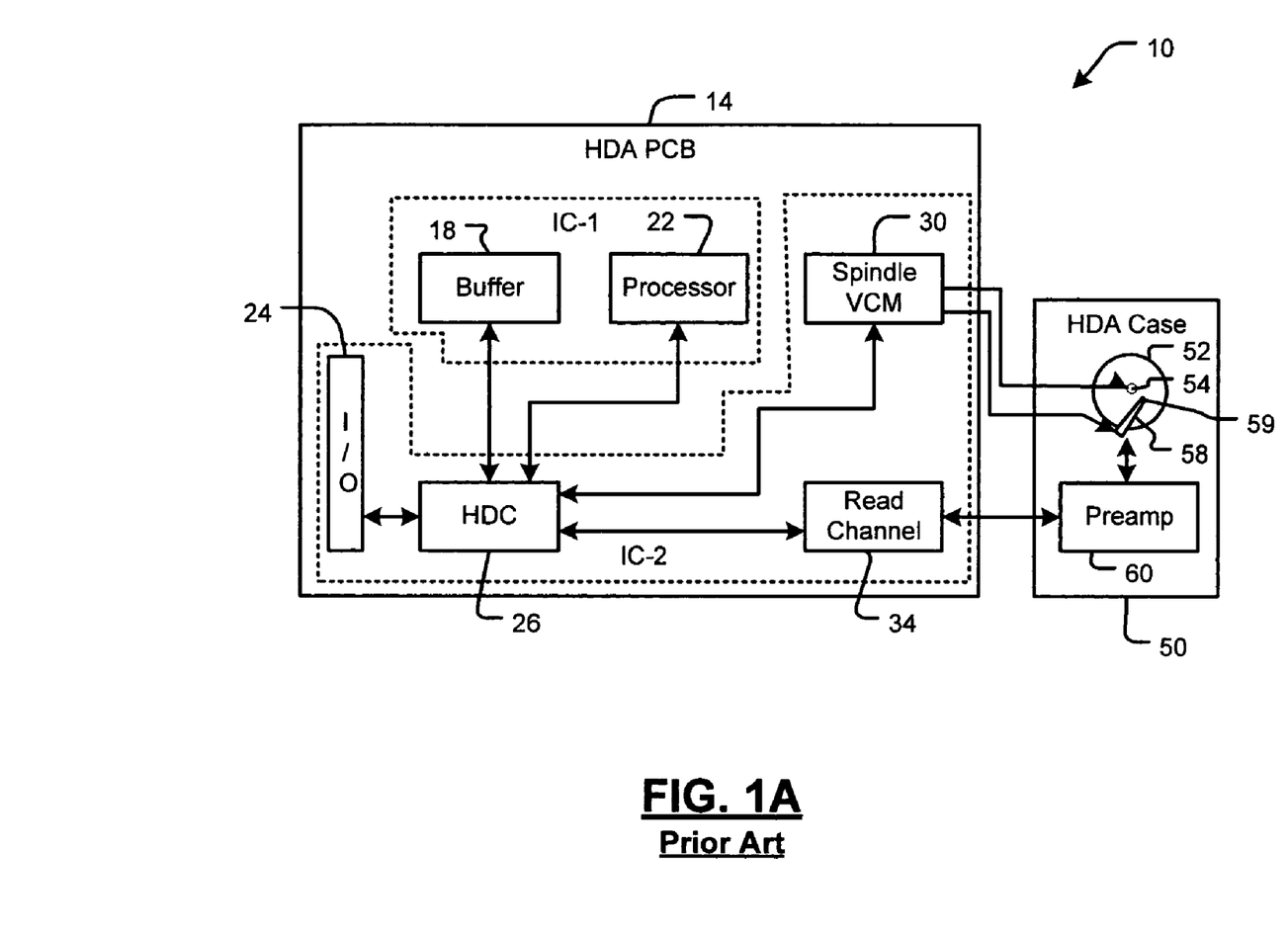
FIG. 1A is a functional block diagram of an exemplary hard disk drive according to the prior art.

Referring now to FIG. 1A, hard disk drive (HDD) 10 includes a hard drive assembly (HDA) printed circuit board assembly (PCBA) 14. A buffer module 18 stores data that is associated with control of the HDD 10. The buffer module 18 may employ SDRAM or other types of low latency memory. A processor 22 that is arranged on the HDA PCBA 14 performs processing that is related to the operation of the HDD 10. A hard disk control module (HDC) 26 communicates with an input/output interface 24 and with a spindle/voice coil motor (VCM) driver module 30 and/or a read/write channel module 34.

During write operation, read/write channel module 34 encodes the data to be written via a read/write device 59, as described in detail hereinbelow. The read/write channel module 34 processes the signal for reliability and may include, for example, error correction coding (ECC), run length limited coding (RLL), and the like. During read operation, the read/write channel module 34 converts an analog output of the read/write device 59 to a digital signal. The converted signal is then detected and decoded by known techniques to recover the data written on the HDD.

As can be appreciated, one or more of the functional blocks of the HDA PCBA 14 may be implemented by a single integrated circuit (IC) or chip. For example, a first integrated circuit 1C-1 may include the buffer module 18 and the processor 22. A second integrated circuit 1C-2 may implement the HDC module 26, the spindle VCM module 30, the read write channel module 34 and/or the I/O interface 24. Still other component combinations may be implemented as integrated circuit(s). For example, the processor 22 and the HDC module 26 may be implemented by a single integrated circuit. The spindle/VCM driver module 30 and/or the read/write channel module 34 may also be implemented by the same integrated circuit as the processor 22 and/or the HDC module 26.

A hard drive assembly (HDA) case 50 provides a housing for one or more hard drive platters 52, which include a magnetic coating that stores magnetic fields. The platters 52 are rotated by a spindle motor 54. Generally the spindle motor 54 rotates the hard drive platter 52 at a fixed speed during the read/write operations. One or more read/write arms 58 move relative to the platters 52 to read and/or write data to/from the hard drive platters 52. The spindle/VCM driver module 30 controls the spindle motor 54, which rotates the platter 52. The spindle/VCM driver module 30 also generates control signals that position the read/write arm 58, for example using a voice coil actuator, a stepper motor or any other suitable actuator.

The read/write device 59 is located near a distal end of the read/write arm 58. The read/write device 59 includes a write element such as an inductor that generates a magnetic field. The read/write device 59 also includes a read element (such as a magneto-resistive (MR) element) that senses the magnetic field on the platter 52. A preamp module 60 amplifies analog read/write signals. When reading data, the preamp module 60 amplifies low level signals from the read element and outputs the amplified signal to the read/write channel device. While writing data, a write current is generated which flows through the write element of the read/write device 59 is switched to produce a magnetic field having a positive or negative polarity. The positive or negative polarity is stored by the hard drive platter 52 and is used to represent data.

Figure 1B:
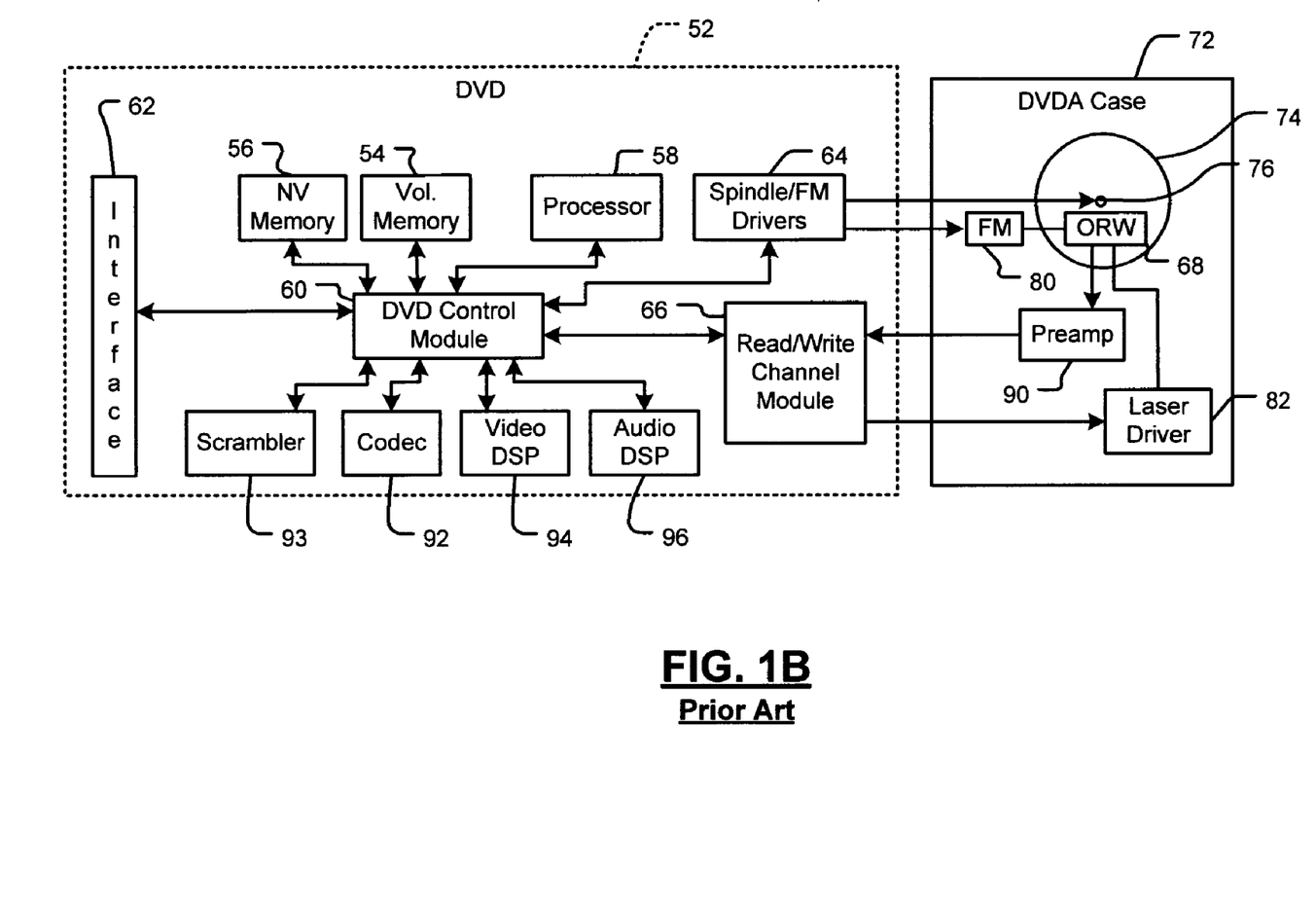
FIG. 1B is a functional block diagram of an exemplary digital versatile disc (DVD) according to the prior art.

Referring now to FIG. 1B, an exemplary DVD system 61. A DVD PCBA 62 includes a buffer 64 that stores read data, write data and/or volatile control code that is associated the control of the DVD system 61. The buffer 64 may employ volatile memory such as SDRAM or other types of low latency memory. Nonvolatile memory 66 such as flash memory can also be used for critical data such as data relating to DVD write formats and/or other nonvolatile control code. A processor 68 arranged on the DVD PCBA 62 performs data and/or control processing that is related to the operation of the DVD system 61. The processor 68 also performs decoding of copy protection and/or compression/decompression as needed. A DVD control module 70 communicates with an input/output interface 72 and with a spindle/feed motor (FM) driver 74 and/or a read/write channel module 76. The DVD control module 70 coordinates control of the spindle/FM driver 74, the read/write channel module 76 and the processor 68 and data input/output via the interface 72.

During write operations, the read/write channel module 76 encodes the data to be written by an optical read/write (ORW) or optical read only (OR) device 78 to the DVD platter. The read/write channel module 76 processes the signals for reliability and may apply, for example, ECC, RLL, and the like. During read operations, the read/write channel module 76 converts an analog output of the ORW or OR device 78 to a digital signal. The converted signal is then detected and decoded by known techniques to recover the data that was written on the DVD.

A DVD assembly (DVDA) 82 includes a DVD medium 84 that stores data optically. The medium 84 is rotated by a spindle motor that is schematically shown at 86. The spindle motor 86 rotates the DVD medium 84 at a controlled and/or variable speed during the read/write operations. The ORW or OR device 78 moves relative to the DVD medium 84 to read and/or write data to/from the DVD medium 84. The ORW or OR device 78 typically includes a laser and an optical sensor.

For DVD read/write and DVD read only systems, the laser is directed at tracks on the DVD that contain lands and pits during read operations. The optical sensor senses reflections caused by the lands/pits. In some DVD read/write (RW) applications, a laser may also be used to heat a die layer on the DVD platter during write operations. If the die is heated to one temperature, the die is transparent and represents one binary digital value. If the die is heated to another temperature, the die is opaque and represents the other binary digital value. Other techniques for writing DVDs may be employed.

The spindle/FM driver 74 controls the spindle motor 80, which controllably rotates the DVD medium 84. The spindle/FM driver 74 also generates control signals that position the feed motor 90, for example using a voice coil actuator, a stepper motor or any other suitable actuator. The feed motor 90 typically moves the ORW or OR device 78 radially relative to the DVD medium 84. A laser driver 92 generates a laser drive signal based on an output of the read/write channel module 76. The DVDA 82 includes a preamp circuit 93 that amplifies analog read signals. When reading data, the preamp circuit 93 amplifies low level signals from the ORW or OR device and outputs the amplified signal to the read/write channel module device 76.

The DVD system 61 may further include a codec module 94 that encodes and/or decodes video such as any of the MPEG formats. A scrambler 97 may be used to perform data scrambling. Audio and/or video digital signal processors and/or modules 96 and 95, respectively, perform audio and/or video signal processing, respectively.

SUMMARY

A drive system comprises a printed circuit board (PCB). A first integrated circuit (IC) is associated with the PCB. A drive assembly case is connected to the PCB. At least part of the first IC is in thermal contact with the drive assembly case. The drive assembly case dissipates thermal energy generated by the first IC.

In other features, a hard disk drive system comprises the drive system. A digital versatile disc (DVD) system comprises the drive system. The first IC is arranged adjacent to one side of the PCB and the drive assembly case is arranged adjacent to the one side of the PCB.

The hard disk drive system further comprises a platter, a read/write arm that reads and writes data to the platter, a spindle motor that rotates the platter, and a preamp module that communicates with the read/write arm, wherein the platter, the read/write arm and the spindle motor are housed in the drive assembly case.

In other features, a second integrated circuit is in thermal contact with the drive assembly case. A thermal interface material is in thermal contact with the second integrated circuit and the drive assembly case.

A method of dissipating heat in a drive system comprises providing a printed circuit board (PCB), a first integrated circuit (IC) and a drive assembly case; and arranging at least part of the first IC in thermal contact with the drive assembly case. The drive assembly case dissipates thermal energy generated by the first IC.

In other features, the method includes arranging the first IC adjacent to one side of the PCB and the drive assembly case adjacent to the one side of the PCB. The method includes providing a second integrated circuit; and arranging the second integrated circuit in thermal contact with the drive assembly case.

In still other features, the method includes providing a second integrated circuit; and arranging a thermal interface material in thermal contact with the second integrated circuit and the drive assembly case.

A method of dissipating heat in a drive system comprises providing a printed circuit board (PCB), a first integrated circuit (IC), and a drive assembly case; arranging a first thermal interface material in thermal contact with the first IC; and arranging the drive assembly case in thermal contact with the thermal interface material. The drive assembly case dissipates thermal energy generated by the first IC.

In other features, the method includes arranging the first IC adjacent to one side of the PCB and the drive assembly case adjacent to the one side of the PCB. The method includes arranging the first IC adjacent to one side of the PCB and the drive assembly case adjacent to another side of the PCB. The method includes arranging a second integrated circuit in thermal contact with the drive assembly case. The method includes providing a second integrated circuit; and arranging a second thermal interface material in thermal contact with the second integrated circuit and the drive assembly case.

A method of providing a drive system comprises providing a printed circuit board (PCB) including a plurality of vias, a first integrated circuit (IC), and a drive assembly case; arranging the first IC in thermal contact with first ends of the plurality of vias; and arranging a thermal interface material in thermal contact with second ends of the plurality of vias and the drive assembly case, wherein the drive assembly case dissipates thermal energy generated by the first IC.

In other features, the method includes arranging the first IC adjacent to one side of the PCB and the case adjacent to an opposite side of the PCB. The method includes connecting a second integrated circuit (IC) to one side of the PCB in contact with first ends of the plurality of vias.

A method of dissipating heat in a drive system comprises providing a printed circuit board (PCB), a first integrated circuit (IC), and a drive assembly case that includes a first portion and a second portion that at least partially enclose the PCB; arranging the first portion adjacent to the one side of the PCB; arranging the second portion adjacent to an opposite side of the PCB; and arranging the first IC in thermal contact with the first portion of the drive assembly case, wherein the drive assembly case dissipates thermal energy generated by the first IC.

In other features, the method includes providing a plurality of vias in the first IC; arranging the first IC in thermal contact with first ends of the plurality of vias; and arranging second ends of the plurality of vias in thermal contact with the second portion. The method includes arranging a thermal interface material in thermal contact with the second portion, wherein the first IC further comprises a plurality of vias; arranging the first IC in thermal contact with first ends of the plurality of vias; and arranging second ends of the plurality of vias in thermal contact with the thermal interface material.

A method for providing a drive system comprises providing a printed circuit board (PCB) include a plurality of vias, a first integrated circuit (IC), and a drive assembly case that includes a first portion and a second portion that at least partially enclose the PCB; arranging the first IC in thermal contact with first ends of the plurality of vias; arranging the first portion adjacent to the one side and the second portion is adjacent to an opposite side of the PCB; and arranging second ends of the vias in thermal contact with the second portion of the drive assembly case, wherein the drive assembly case dissipates thermal energy generated by the first IC.

In other features, the method includes arranging a surface of the first IC in thermal contact with the first portion of the drive assembly case. The method includes arranging a thermal interface material in thermal contact with the first portion; and arranging a surface of the first IC in thermal contact with the thermal interface material.

A method for providing a drive system comprises providing a printed circuit board (PCB) including a plurality of vias, a first integrated circuit (IC) associated with one side of the PCB and that is in thermal contact with first ends of the plurality of vias, and a drive assembly case that at least partially encloses the PCB; and arranging a thermal interface material in thermal contact with the drive assembly case; arranging a first portion of the drive assembly case adjacent to the one side and a second portion of the drive assembly adjacent to an opposite side of the PCB; and arranging second ends of the vias in thermal contact with the thermal interface material, wherein the drive assembly case dissipates thermal energy generated by the first IC.

In other features, the method includes arranging a surface of the first IC in thermal contact with the drive assembly case. The method includes arranging a second thermal interface material in thermal contact with the drive assembly case; and arranging a first surface of the first IC in thermal contact with the second thermal interface material.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The present disclosure relates to a low cost thermal solution for dissipating heat when high power integrated circuits (ICs) are used in drive systems. For example, the present invention may be used in hard disk drive (HDD) and digital versatile disc (DVD) systems. The HDD includes a hard disk assembly (HDA) and a HDD printed circuit board assembly (HDD PCBA) with one or more Integrated Circuits (ICs) and/or other electronics components mounted thereon. Some types of HDDs include an external case that is connected to the HDD PCB. While the certain portions of the present disclosure relate to HDD systems, the present disclosure can also be used to dissipate heat within DVD systems.

The ICs tend to generate a lot of heat due to high data flow speeds of the HDD or DVD and integration of more functions and features. As the form factor of the HDD or DVD becomes smaller, the PCB also becomes smaller. Dissipating heat generated by the IC or ICs of the PCB becomes more challenging. According to the present disclosure, the drive assembly case can be used as a thermal heatsink by making the surface of one or more ICs directly contact the drive assembly case and/or using a thermal interface material to allow the thermal contact between the IC or ICs and the drive assembly case.

Figure 2A:
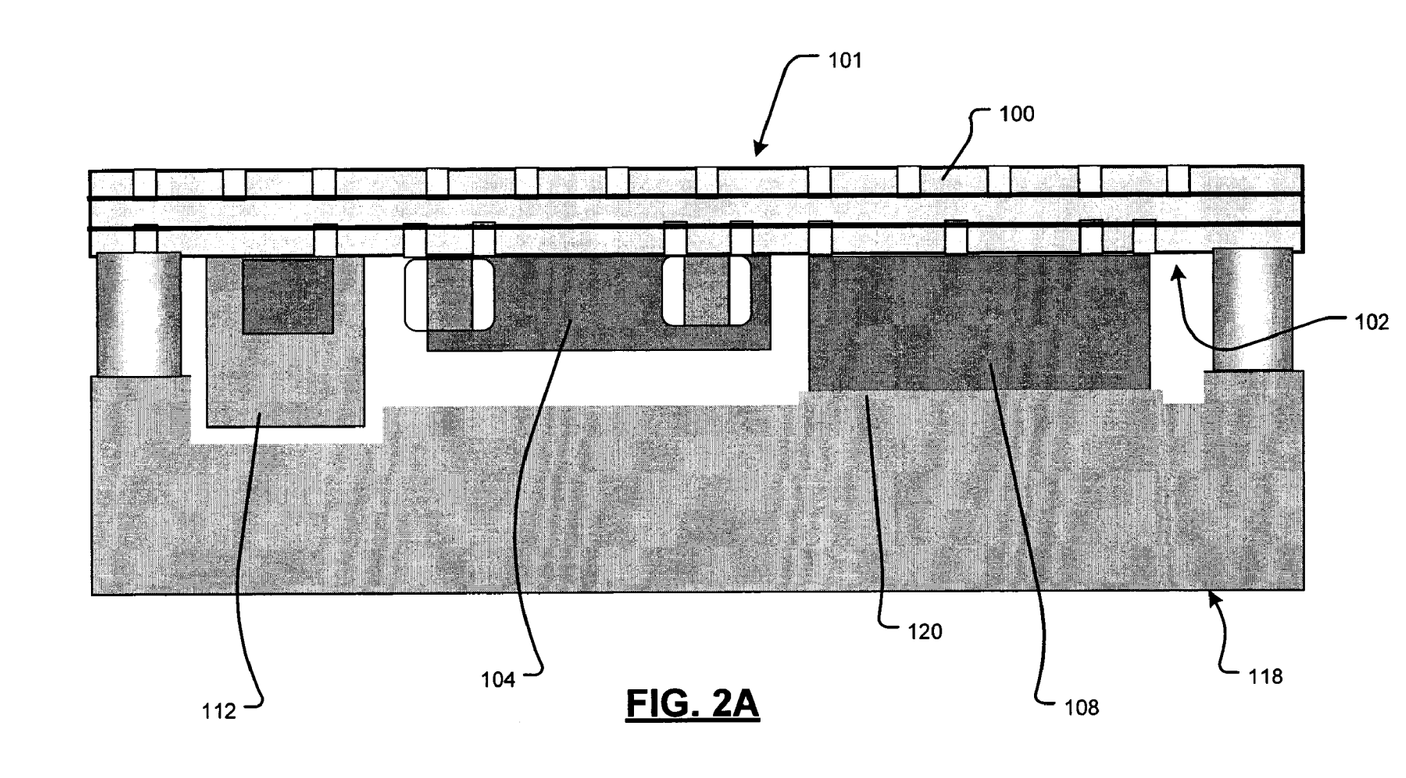
FIG. 2A illustrates a first drive system that is thermally coupled to a drive assembly case according to the present disclosure.
Figure 2B:
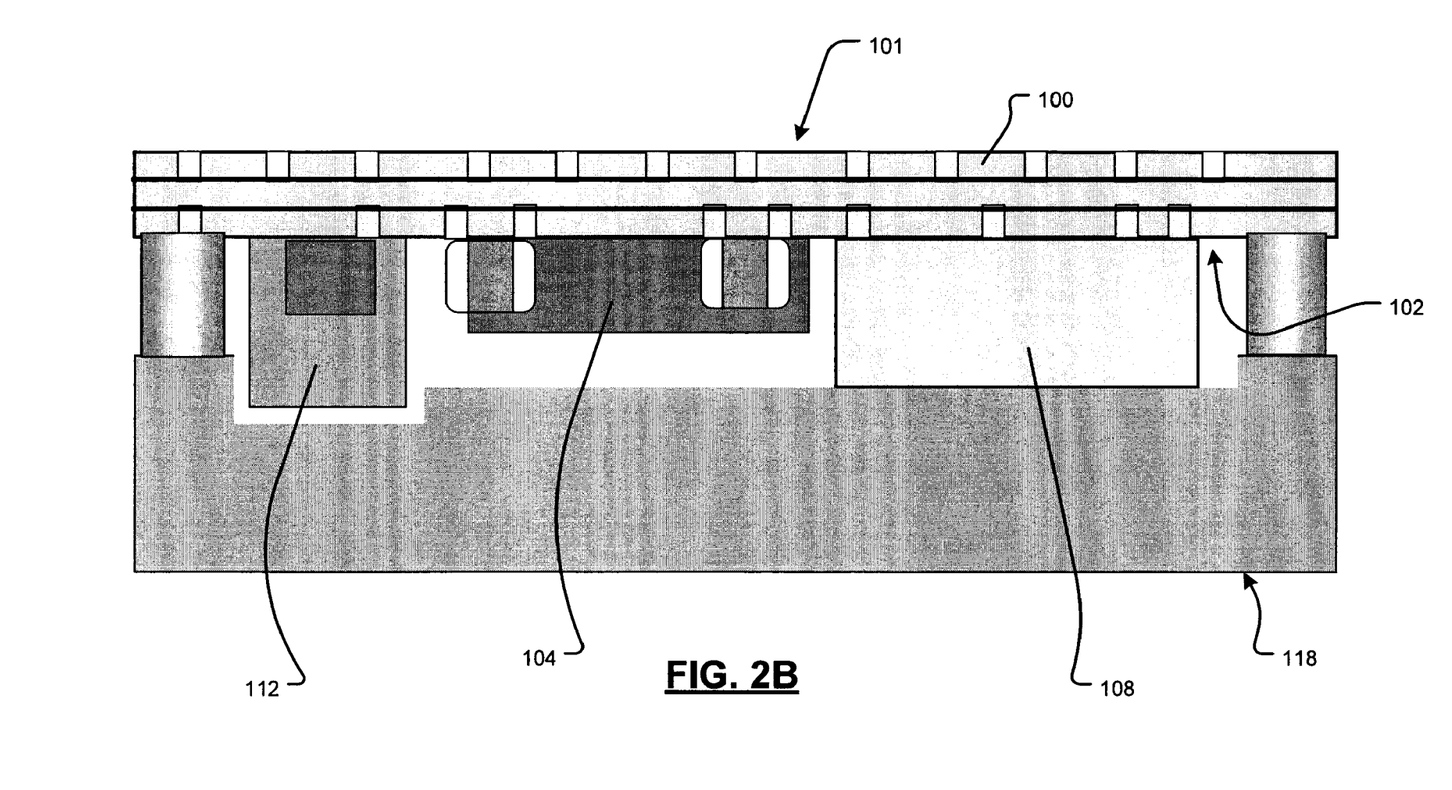
FIG. 2B illustrates the first drive system with an integrated circuit in direct physical contact with the drive assembly case.

Referring now to FIGS. 2A and 2B, the drive assembly case can be used as a thermal heatsink by making the printed circuit board (PCB) contact the drive assembly case through a thermal interface material. More particularly, in FIG. 2A a PCB 100 includes an outer side 101 and an inner side 102. First and second integrated circuits (ICs) 104 and 108 and/or other components 112 are mounted on the outer and/or inner sides 101 and 102 of the PCB 100.

A drive assembly case 118 is connected to the inner side 102 of the PCB 100. A second side of the IC 108 includes a thermal interface material 120 that is located between the IC 108 and the drive assembly case 118. The terminal interface material 120 thermally couples the second side of the IC 108 to the drive assembly case 118. As a result, heat generated by the IC 108 is dissipated by the relatively large surface area of the drive assembly case 118. In FIG. 2B, the IC 108 directly contacts the drive assembly case 118.

Figure 3:
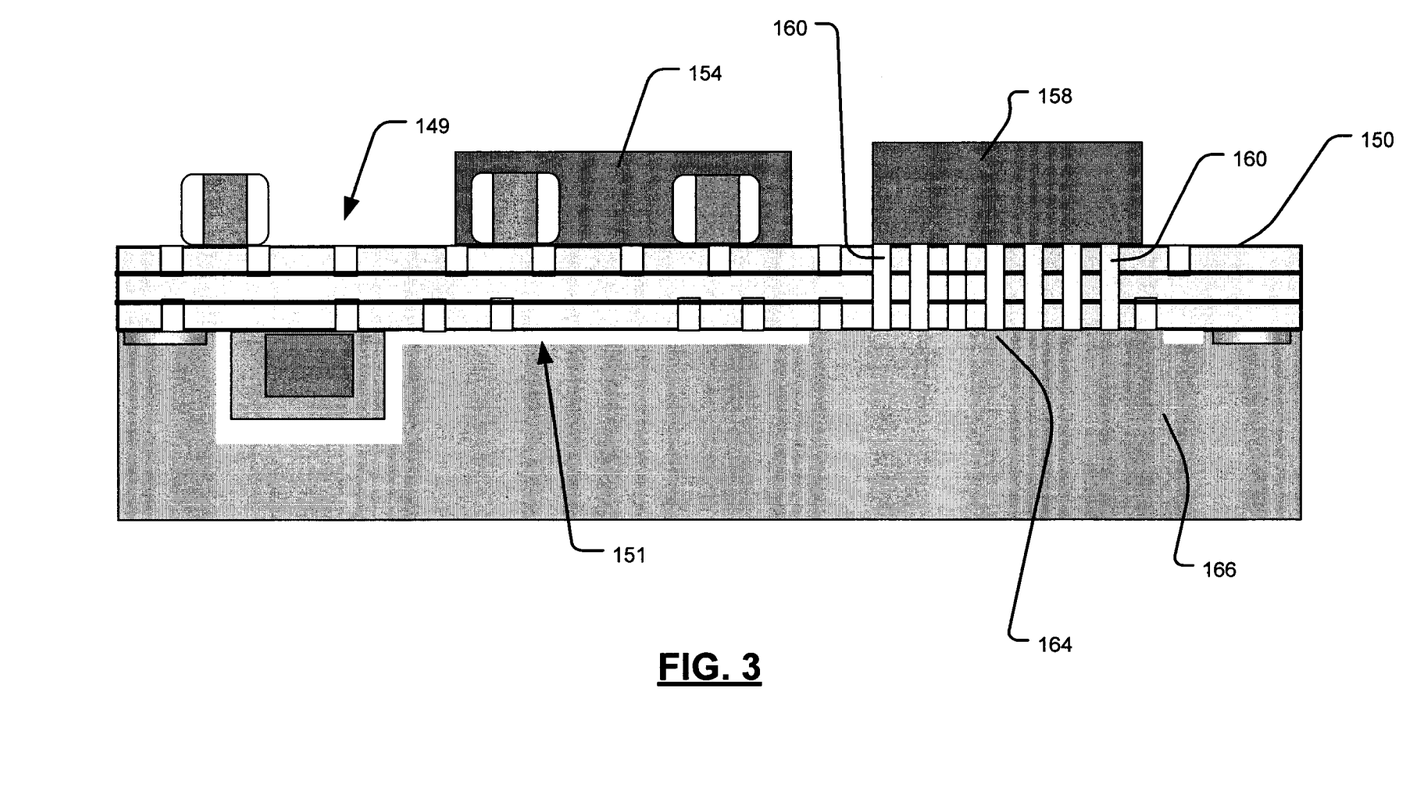
FIG. 3 illustrates a second drive system that is thermally coupled to a drive assembly case according to the present disclosure.

Referring now to FIG. 3, additional thermal vias can be added at the contact area of PCB to further improve thermal performance. One side 149 of a PCB 150 includes first and second ICs 154 and 158 and/or other components 155. The PCB 150 includes vias 160 that extend from the one side 149 of the PCB 150 to another side 151 thereof. A thermal interface material 164 thermally couples opposite ends of the vias 160 of the PCB 150 to a drive assembly case 166. Other components of the HDD or DVD may be connected to either side of the PCB 150 as shown. Direct contact between the vias and the drive assembly case can also be used.

Figure 4:
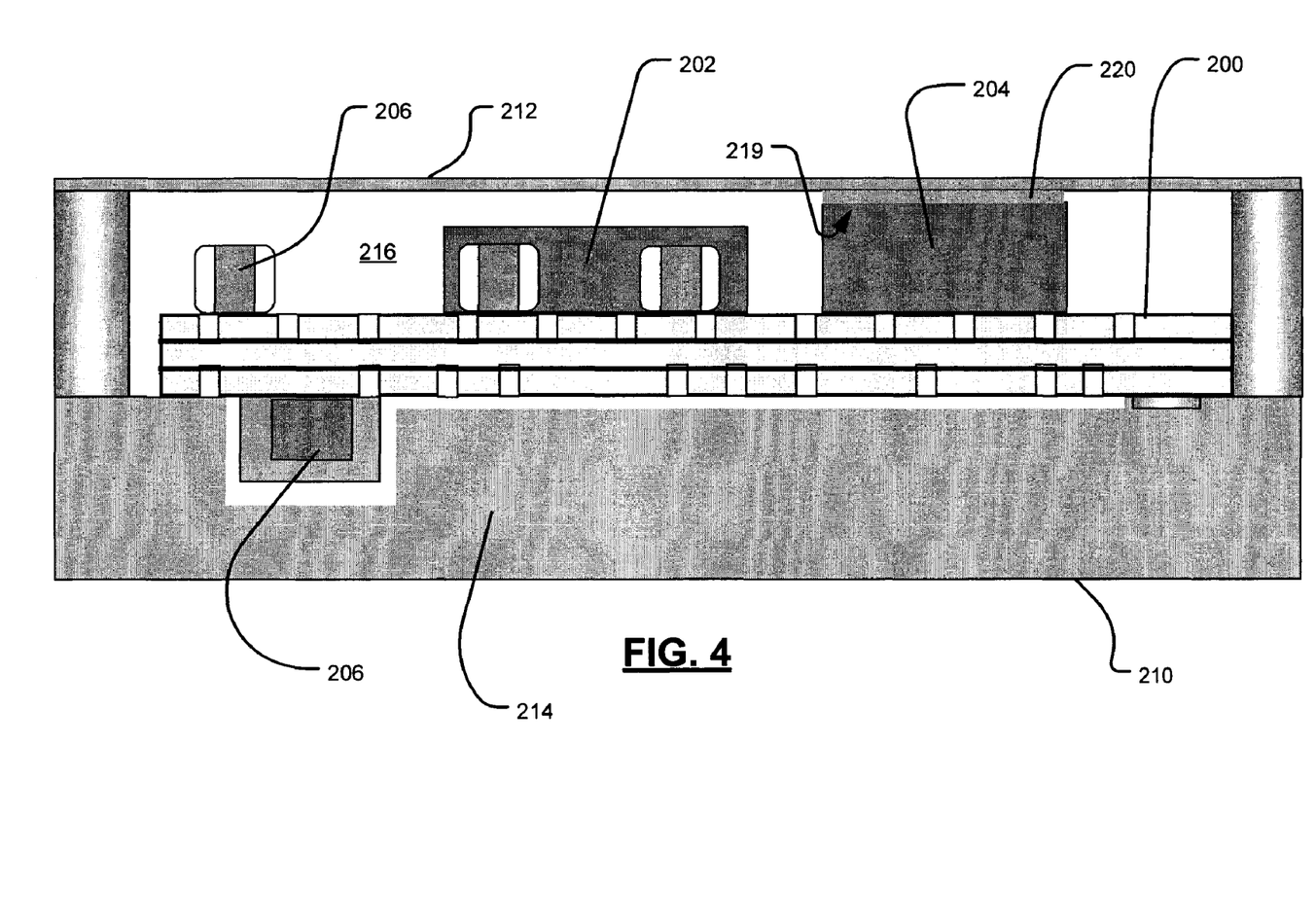
FIG. 4 illustrates a third drive system that is thermally coupled to a drive assembly case according to the present disclosure.

Referring now to FIG. 4, for HDDs or DVDs with the external cases over the PCB, the external case can be used as a thermal heatsink by making the surface of one or more ICs directly contact the external case and/or through a thermal interface material. A PCB 200 includes first and second ICs 202 and 204 and/or other components 206 mounted thereon. The PCB 200 is mounted to the drive assembly case 210 and covered by an external cover 212. The IC 204 includes an outer surface 219 that contacts a thermal interface material 220. The thermal interface material 220, in turn, contacts the external cover 212.

Figure 5:
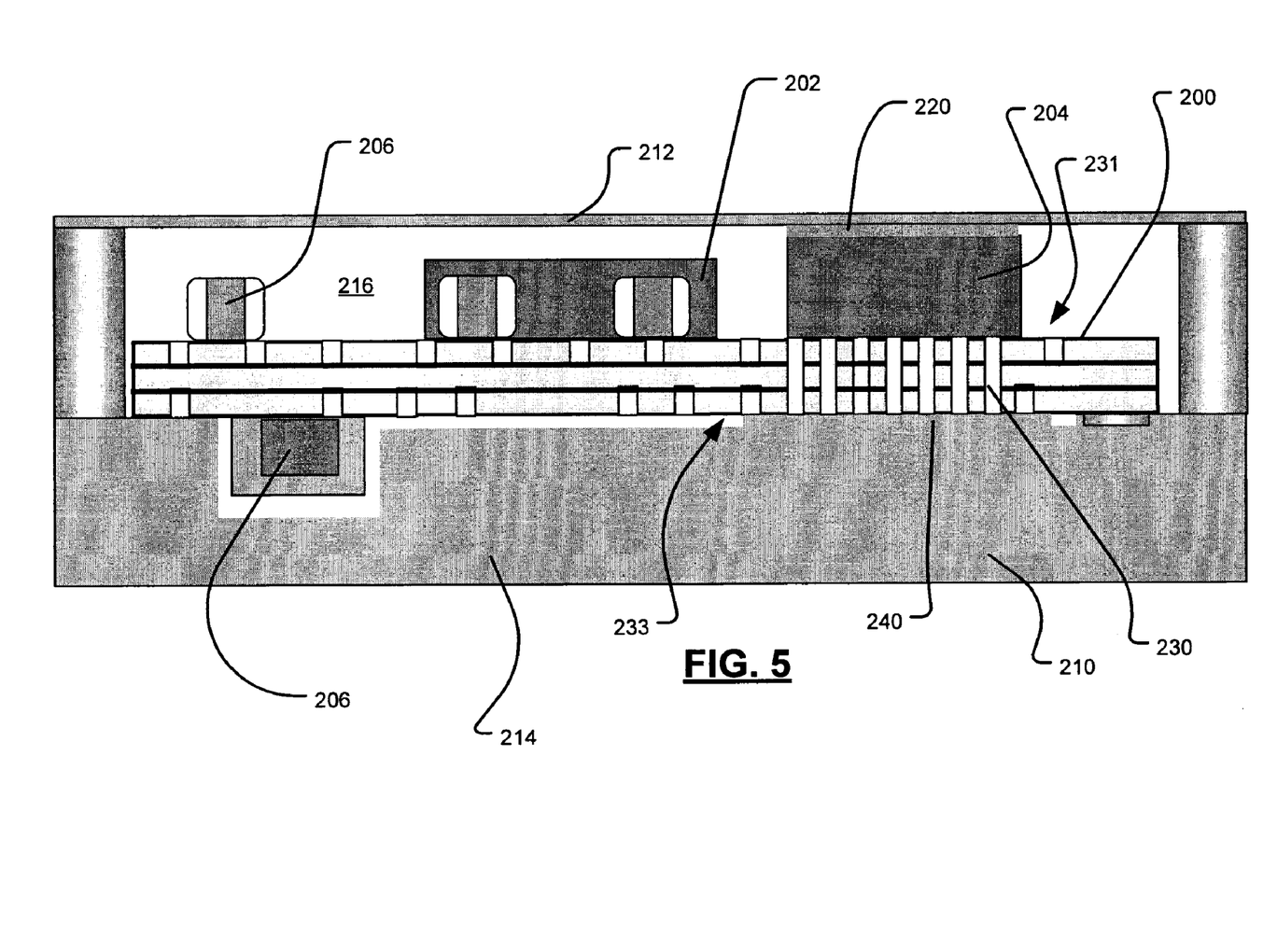
FIG. 5 illustrates a fourth drive system that is thermally coupled to a drive assembly case according to the present disclosure.

Referring now to FIG. 5, more thermal vias can be added at the contact area of PCB to further improve the thermal performance. The PCB 200 includes vias 230 that extend through and/or provide a thermal path through the PCB 200. A thermal interface material 240 provides a thermal path between the vias and the drive assembly case 210.

As can be appreciated, while only one IC is shown in contact with the drive assembly case in FIGS. 2-5, the solution can be applied to two or more ICs on the PCB. Furthermore, while FIG. 2B shows direct physical contact between the drive assembly case and the IC, FIGS. 3-5 may also be arranged in direct physical contact as well. Furthermore, embodiments may include ICs in direct and/or indirect contact via the thermal interface material.

Suitable examples of thermal interface materials include thermal conductive adhesive tape, thermal conductive elastomer, thermal conductive compound and thermal grease although other thermal interface materials can be used.

Figure 6A:
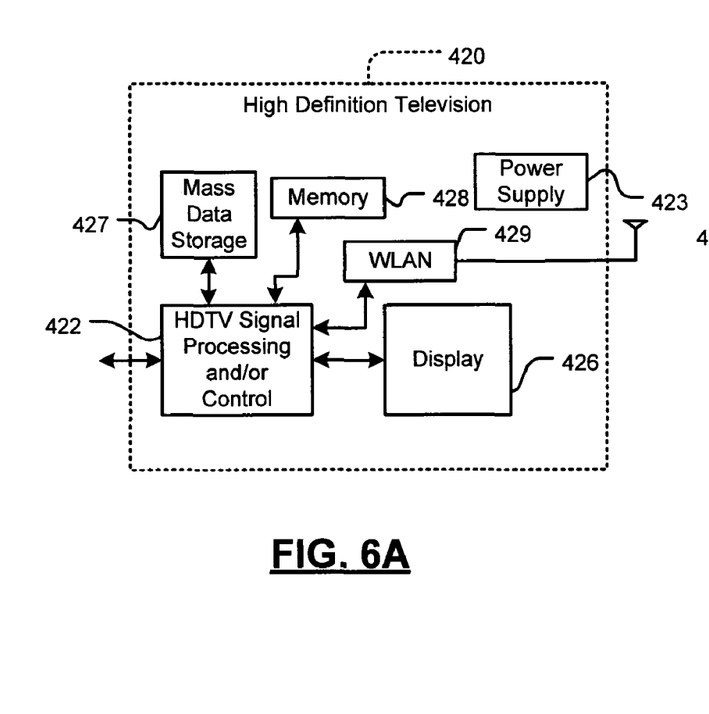
FIG. 6A is a functional block diagram of a high definition television.

Referring now to FIG. 6A, the present invention can be implemented in mass data storage and/or a DVD of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Figure 6B:
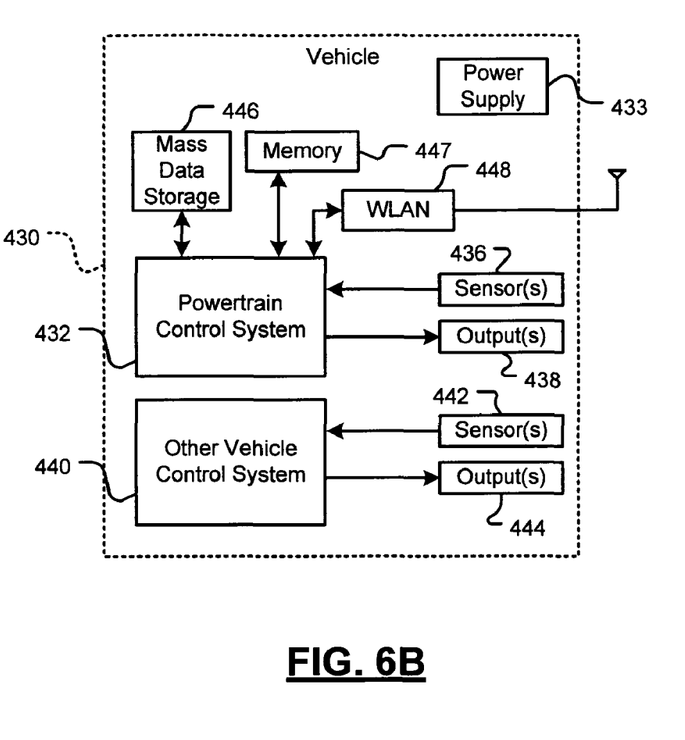
FIG. 6B is a functional block diagram of a vehicle control system.

Referring now to FIG. 6B, the present invention may implement and/or be implemented in mass data storage of a vehicle control system and/or a vehicle-based DVD. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 6C:
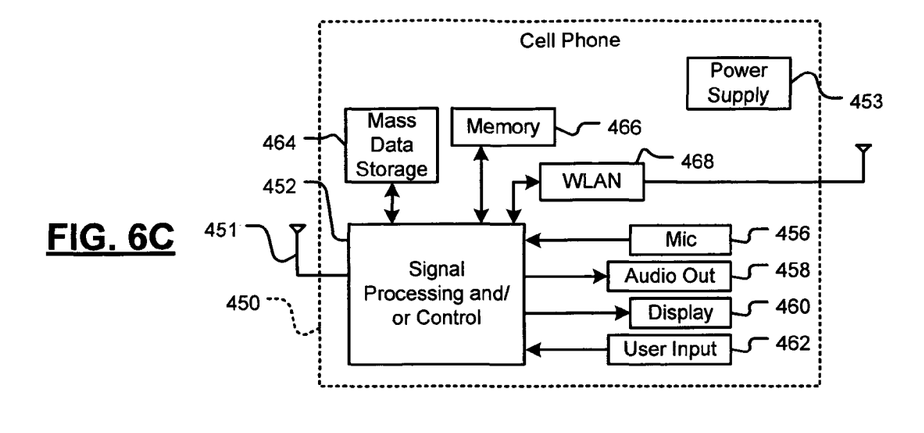
FIG. 6C is a functional block diagram of a cellular phone.

Referring now to FIG. 6C, the present invention can be implemented in mass data storage and/or a DVD of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 6D:
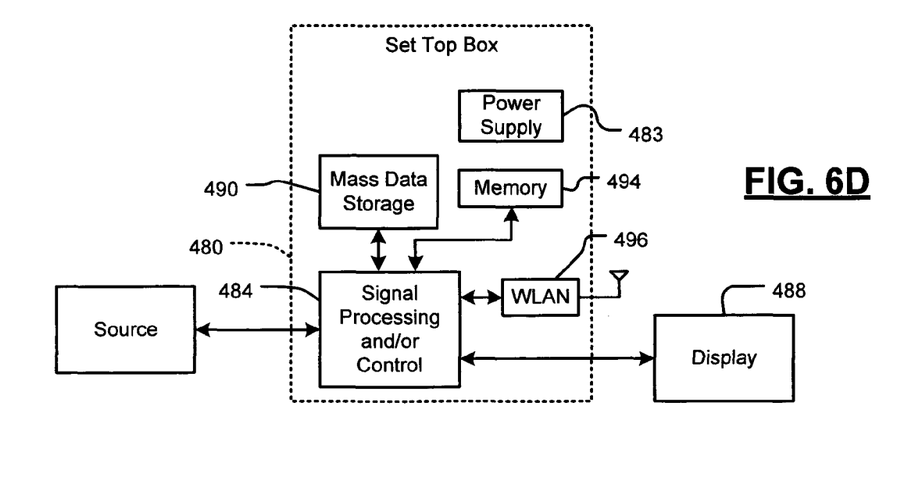
FIG. 6D is a functional block diagram of a set top box.

Referring now to FIG. 6D, the present invention can be implemented in mass data storage and/or a DVD of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 6E:
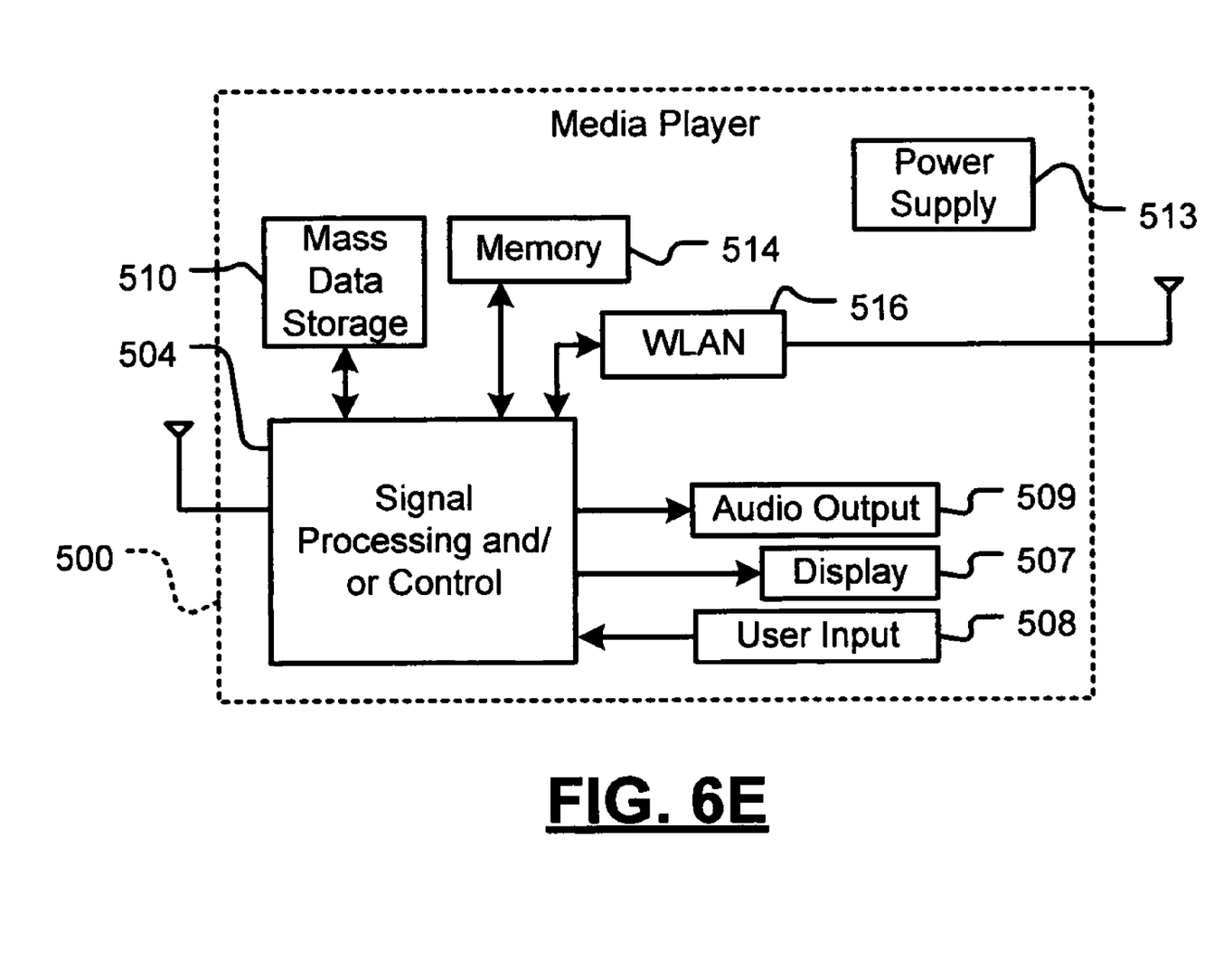
FIG. 6E is a functional block diagram of a media player.

Referring now to FIG. 6E, the present invention can be implemented in mass data storage and/or a DVD of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A drive system, comprising:
   a printed circuit board;
   a first integrated circuit associated with the printed circuit board;
   a drive assembly case that is connected to the printed circuit board; and
   a first thermal interface material,
   wherein (i) the first thermal interface material is in thermal contact with the first integrated circuit and (ii) the drive assembly case is in thermal contact with the first thermal interface material, and
   wherein the drive assembly case dissipates thermal energy generated by the first integrated circuit.

2. A storage device comprising the drive system of claim 1.

3. The storage device of claim 2, wherein the storage device is a hard disk drive or a digital versatile disc drive.

4. The drive system of claim 1, wherein:
   the first integrated circuit is arranged adjacent to a first side of the printed circuit board; and
   the drive assembly case is arranged adjacent to the first side of the printed circuit board.

5. The drive system of claim 1, wherein:
   the first integrated circuit is arranged adjacent to a first side of the printed circuit board; and
   the drive assembly case is arranged adjacent to a second side of the printed circuit board,
   wherein the second side is opposite to the first side.

6. The drive system of claim 3, further comprising:
   a platter;
   a read/write arm configured to read data from and write data to the platter; and
   a spindle motor configured to rotate the platter,
   wherein the platter, the read/write arm and the spindle motor are housed in the drive assembly case.

7. The drive system of claim 1, further comprising a second integrated circuit in thermal contact with the drive assembly case.

8. The drive system of claim 1, further comprising:
   a second integrated circuit; and
   a second thermal interface material in thermal contact with (i) the second integrated circuit and (ii) the drive assembly case.

9. The drive system, of claim 1, wherein:
   the printed circuit board includes a plurality of vias;
   the first integrated circuit is associated with a first side of the printed circuit board, the first integrated circuit being respectively in thermal contact with first ends of the plurality of vias;
   the drive assembly case is connected to a second side of the printed circuit board, the second side being opposite the first side; and
   the first thermal interface material is respectively in thermal contact with (i) second ends of the plurality of vias and (ii) the drive assembly case.

10. The drive system of claim 9, further comprising a second integrated circuit (i) associated with the first side of the printed circuit board and (ii) contacting the first ends of the plurality of vias.

11. The drive system, of claim 1, wherein:
    the drive assembly case includes a first portion and a second portion, each of the first portion and the second portion at least partially enclosing the printed circuit board,
    wherein (i) the first portion is arranged adjacent to a first side of the printed circuit board and (ii) the second portion is arranged adjacent to a second side of the printed circuit board, and
    wherein the first integrated circuit is in thermal contact with the first portion of the drive assembly case.

* * * * *